United States Patent
Kannan et al.

(10) Patent No.: US 10,734,908 B2
(45) Date of Patent: Aug. 4, 2020

(54) SYNCHRONOUS RECTIFIER CONTROL

(71) Applicant: TEXAS INSTRUMENTS INCORPORATED, Dallas, TX (US)

(72) Inventors: Bharath Kannan, Merrimack, NH (US); Bing Lu, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/427,094

(22) Filed: May 30, 2019

(65) Prior Publication Data
US 2019/0379293 A1   Dec. 12, 2019

Related U.S. Application Data

(60) Provisional application No. 62/683,120, filed on Jun. 11, 2018.

(51) Int. Cl.
| | |
|---|---|
| *H02M 3/335* | (2006.01) |
| *H02M 1/08* | (2006.01) |
| *H03K 19/20* | (2006.01) |
| *H02M 1/00* | (2006.01) |

(52) U.S. Cl.
CPC ......... *H02M 3/33592* (2013.01); *H02M 1/08* (2013.01); *H02M 2001/0035* (2013.01); *H03K 19/20* (2013.01)

(58) Field of Classification Search
CPC .................. H02M 3/33592; H02M 2001/0035
See application file for complete search history.

(56) References Cited

U.S. PATENT DOCUMENTS

| | | | |
|---|---|---|---|
| 2009/0016083 A1* | 1/2009 | Soldano | H02M 3/33592 363/20 |
| 2009/0316441 A1* | 12/2009 | Hu | H02M 3/33592 363/21.06 |
| 2015/0023062 A1* | 1/2015 | Hyugaji | H02M 3/33592 363/16 |

OTHER PUBLICATIONS

U.S. Appl. No. 16/448,024, "Synchronous Rectifier Control Circuit," filed Jun. 21, 2019, 38 pages.

* cited by examiner

*Primary Examiner* — Harry R Behm
(74) *Attorney, Agent, or Firm* — Ray A. King; Charles A. Brill; Frank D. Cimino

(57) ABSTRACT

A synchronous rectifier control circuit includes a drain voltage input, a gate voltage output, a gate voltage generation circuit, a burst detection circuit, an on-time monitor circuit, and a burst mode reset circuit. The gate voltage generation circuit includes a first input coupled to the drain voltage input, and an output coupled to the gate voltage output. The burst detection circuit includes a first input coupled to the drain voltage input, and an output coupled to a second input of the gate voltage generation circuit. The on-time monitor circuit includes an input coupled to the output of the gate voltage generation circuit. The burst mode reset circuit includes a first input coupled to the drain voltage input, a second input coupled to an output of the on-time monitor circuit, and an output coupled to a second input of the burst detection circuit.

19 Claims, 9 Drawing Sheets

SYNCHRONOUS RECTIFIER CONTROL

CROSS-REFERENCE TO RELATED APPLICATIONS

The present application claims priority to U.S. Provisional Patent Application No. 62/683,120, filed Jun. 11, 2018, entitled "Adaptive Turn-On Delay for Negative Current Protection and Reduced VDS Stress in Resonant Converter," which is hereby incorporated herein by reference in its entirety.

BACKGROUND

A DC/DC converter is a switching power supply that accepts a DC input voltage and generates a DC output voltage that is typically different from the DC input voltage. DC/DC converters include a switching transistor that is turned on and off to charge and discharge an inductor. Switching losses in the transistor may be reduced by coupling a resonant inductor-capacitor circuit to the switching transistor to produce sinusoidal rather than square-wave current waveforms. Such DC/DC converters are referred to as resonant DC/DC converters.

LLC resonant converters, which include a resonant circuit using two inductors and a capacitor, provide a number of benefits over other resonant converter architectures. For example, LLC resonant converters offer high efficiency over a wide range on input voltages and loading conditions. Synchronous rectifiers are used on the secondary side of an LLC resonant converter to improve efficiency.

SUMMARY

A synchronous rectifier control circuit that reduces drain-source voltage stress in the transistors that implement the synchronous rectifiers of a resonant DC/DC converter is disclosed herein. In one example, a synchronous rectifier control circuit includes a drain voltage input, a gate voltage output, a gate voltage generation circuit, a burst detection circuit, and a burst mode reset circuit. The gate voltage generation circuit includes a first input coupled to the drain voltage input, and an output coupled to the gate voltage output. The burst detection circuit includes a first input coupled to the drain voltage input, and an output coupled to a second input of the gate voltage generation circuit. The burst mode reset circuit includes an input coupled to the drain voltage input, and an output coupled to a second input of the burst detection circuit.

In another example, a synchronous rectifier control circuit includes a burst detection circuit and a gate voltage generation circuit. The burst detection circuit is configured to set a flag indicating that a switch-mode power supply circuit coupled to a synchronous rectifier is operating in burst mode based on a drain voltage of a synchronous rectifier. The gate voltage generation circuit is configured to generate a control signal for a synchronous rectifier based on the drain voltage of the synchronous rectifier, and the flag set by the burst detection circuit.

In a further example, a switch-mode power supply includes a transformer, a synchronous rectifier, and a synchronous rectifier control circuit. The synchronous rectifier is coupled to a secondary winding of the transformer. The synchronous rectifier control circuit is coupled to the synchronous rectifier. The synchronous rectifier control circuit includes an input, and an output, a gate voltage generation circuit, a burst detection circuit, and a burst mode reset circuit. The input is coupled to a drain terminal of the synchronous rectifier. The output is coupled to a gate terminal of the synchronous rectifier. The gate voltage generation circuit includes a first input coupled to the input of the synchronous rectifier control circuit, and an output coupled to the output of the synchronous rectifier control circuit. The burst detection circuit includes a first input coupled to the input of the synchronous rectifier control circuit, and an output coupled to a second input of the gate voltage generation circuit. The burst mode reset circuit includes an input coupled to the input of the synchronous rectifier control circuit, and an output coupled to a second input of the burst detection circuit.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Figure 1:
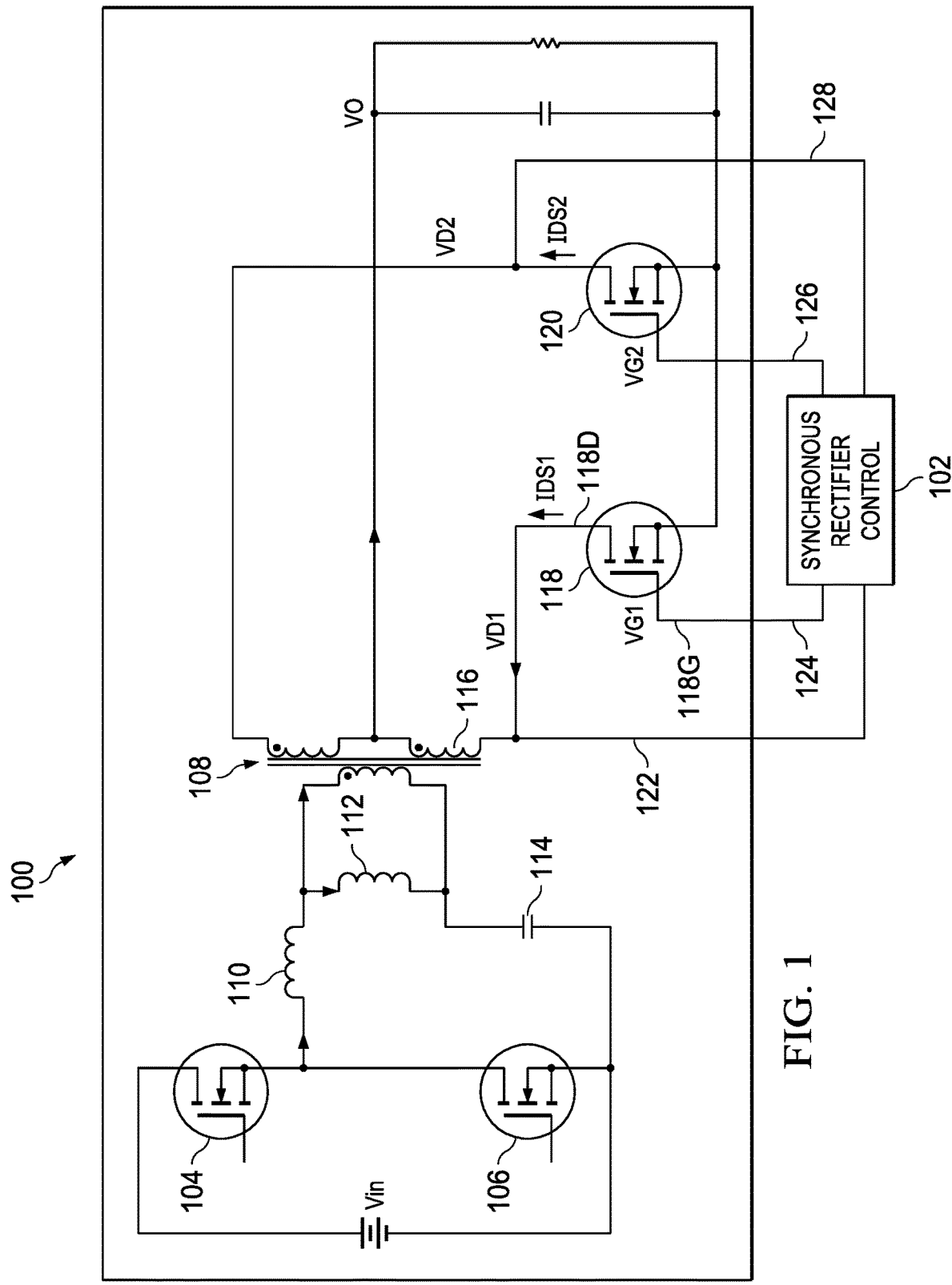
FIG. 1 shows a schematic diagram for an example LLC resonant converter in accordance with this description.

FIG. 1 shows a schematic diagram for an example LLC resonant converter 100 in accordance with this description. The LLC resonant converter 100 includes a high-side switching transistor 104, a low-side switching transistor 106, a transformer 108, an inductor 110, a capacitor 114, a synchronous rectifier 118, a synchronous rectifier 120, and a synchronous rectifier control circuit 102. The high-side switching transistor 104 and the low-side switching transistor 106 form a half-bridge, and the inductor 110, the capacitor 114, and the magnetizing inductance 112 of the transformer 108 form an LLC resonant circuit.

The synchronous rectifier 118 and the synchronous rectifier 120 are coupled to the secondary winding 116 of the transformer 108. The synchronous rectifier 118 and the synchronous rectifier 120 are coupled to, and controlled by the synchronous rectifier control circuit 102. The synchronous rectifier control circuit 102 monitors the drain voltage 122 at the drain terminal 118D of the synchronous rectifier 118, and responsive to the drain voltage 122 generates a gate voltage 124 that is provided to a gate terminal 118G of the synchronous rectifier 118. More specifically, the synchronous rectifier control circuit 102 turns on the synchronous rectifier 118 by detecting the forward biased body diode of the synchronous rectifier 118, and turns off the synchronous rectifier 118 by detecting that current in the synchronous rectifier 118 is near zero. Similarly, synchronous rectifier control circuit 102 monitors the drain voltage 128 of the synchronous rectifier 120, and responsive to the drain voltage 128 generates a gate voltage 126 that is provided to the synchronous rectifier 120.

In one example, when the drain voltage 122 falls below a predetermined turn-on threshold, the synchronous rectifier control circuit 102 generates a high (e.g., 10 volt) gate voltage 124 to turn on the synchronous rectifier 118, and holds the synchronous rectifier 118 on for at least a predetermined minimum on-time. When the minimum on-time expires, the synchronous rectifier control circuit 102 turns off the synchronous rectifier 118 by generating a low (e.g., 0 volt) gate voltage 124 based on drain voltage 122 rising above a predetermined turn-off threshold. The synchronous rectifier control circuit 102 controls the synchronous rectifier 120 in a similar fashion. In some modes of operation (e.g., non-burst), the synchronous rectifier control circuit 102 may control the synchronous rectifier 118 and the synchronous rectifier 120 such that synchronous rectifier 118 and the synchronous rectifier 120 are turned on and off in a complementary manner. That is, the synchronous rectifier 118 is turned on when the synchronous rectifier 120 is off, and vice versa.

Figure 2:
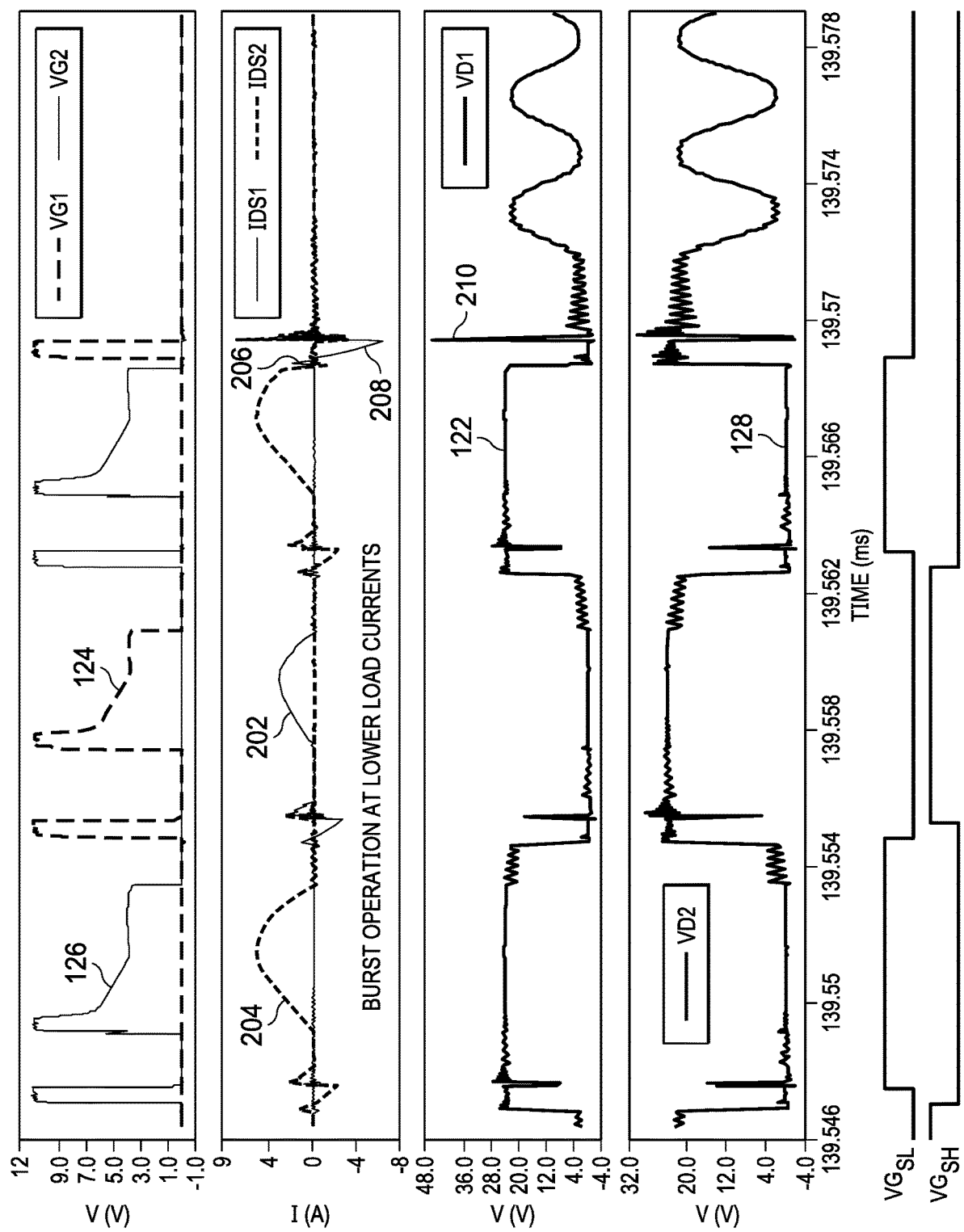
FIG. 2 shows signals generated by burst mode operation of the LLC converter of FIG. 1.

Some implementations of the LLC resonant converter 100 operate in burst mode under light load conditions. In burst mode, the high-side switching transistor 104 and the low-side switching transistor 106 generate a series pulses on the primary side of the transformer 108, and thereafter the high-side switching transistor 104 and the low-side switching transistor 106 may be turned off until the output voltage of the LLC resonant converter 100 falls below a predetermined threshold. FIG. 2 shows signals generated by burst mode operation of the LLC resonant converter 100. The gate voltage (VGa) of the low-side switching transistor 106 and the gate voltage (VGsH) of the high-side switching transistor 104 are shown for reference. In light load conditions, e.g., load conditions suitable for burst mode operation, the current 202 in the synchronous rectifier 118 and the current 204 in the synchronous rectifier 120 exhibit capacitive current spikes that precede the actual current. In FIG. 2, capacitive current spike 206 in the current 202 is shown. The capacitive current spike 206 causes the drain voltage 122 to drop, and the synchronous rectifier control circuit 102 increases the gate voltage 124 to turn on the synchronous rectifier 118, which produces a reverse current 208. The synchronous rectifier control circuit 102 holds the synchronous rectifier 118 on for the minimum on-time, which allows for build up of the reverse current 208. At the end of the minimum on-time, the synchronous rectifier control circuit 102 turns off the synchronous rectifier 118, and the built up reverse current 208 causes a voltage transient 210 on the drain voltage 122. The voltage transient 210, or repeated instances thereof, may damage the synchronous rectifier 118.

Figure 3:
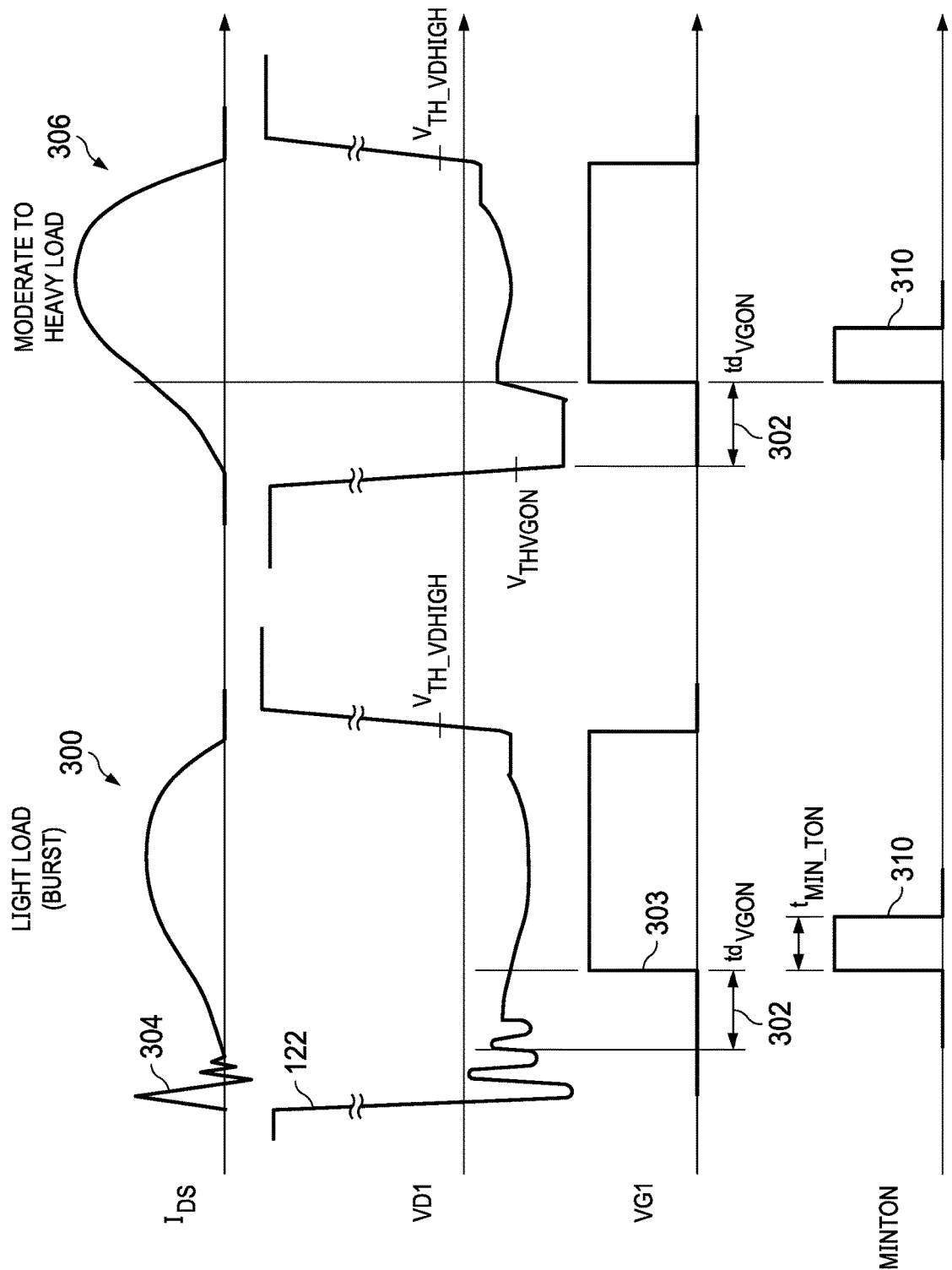
FIG. 3 shows signals generated by burst mode operation of the LLC converter of FIG. 1 using a fixed turn-on delay.

Some implementations of the synchronous rectifier control circuit 102 avoid turn on of the synchronous rectifiers responsive to the burst mode capacitive current spike by providing a fixed long turn-on delay. FIG. 3 shows signals generated by operation of the LLC resonant converter 100 using an implementation of the synchronous rectifier control circuit 102 with a fixed long turn-on delay. In FIG. 3, the signals 300 illustrate operation of the LLC resonant converter 100 with a light load (i.e., in burst mode), and the signals 306 illustrate operation of the LLC resonant converter 100 with a moderate to heavy load (i.e., not burst mode). In the burst mode, the capacitive current spike 304 is generated, and the drain voltage 122 falls in response. However, the relatively long fixed long turn-on delay 302 prevents the synchronous rectifier control circuit 102 from turning on the synchronous rectifier 118 until time 303 when the actual current is flowing in the synchronous rectifier 118. Thus, the fixed long turn-on delay 302 prevents the potentially damaging voltage transient shown in FIG. 2. However, with a moderate to heavy load, the fixed long turn-on delay 302 delays turn on of the synchronous rectifier 118 by the synchronous rectifier control circuit 102, which increases conduction loss in the synchronous rectifier 118, and reduces the efficiency of the LLC resonant converter 100. Additionally, the fixed long turn-on delay 302 in conjunction with the minimum turn-on time 310 limits the frequency range of the LLC resonant converter 100, which restricts inductor size and increases the printed circuit board area needed to implement the LLC resonant converter 100.

Figure 4:
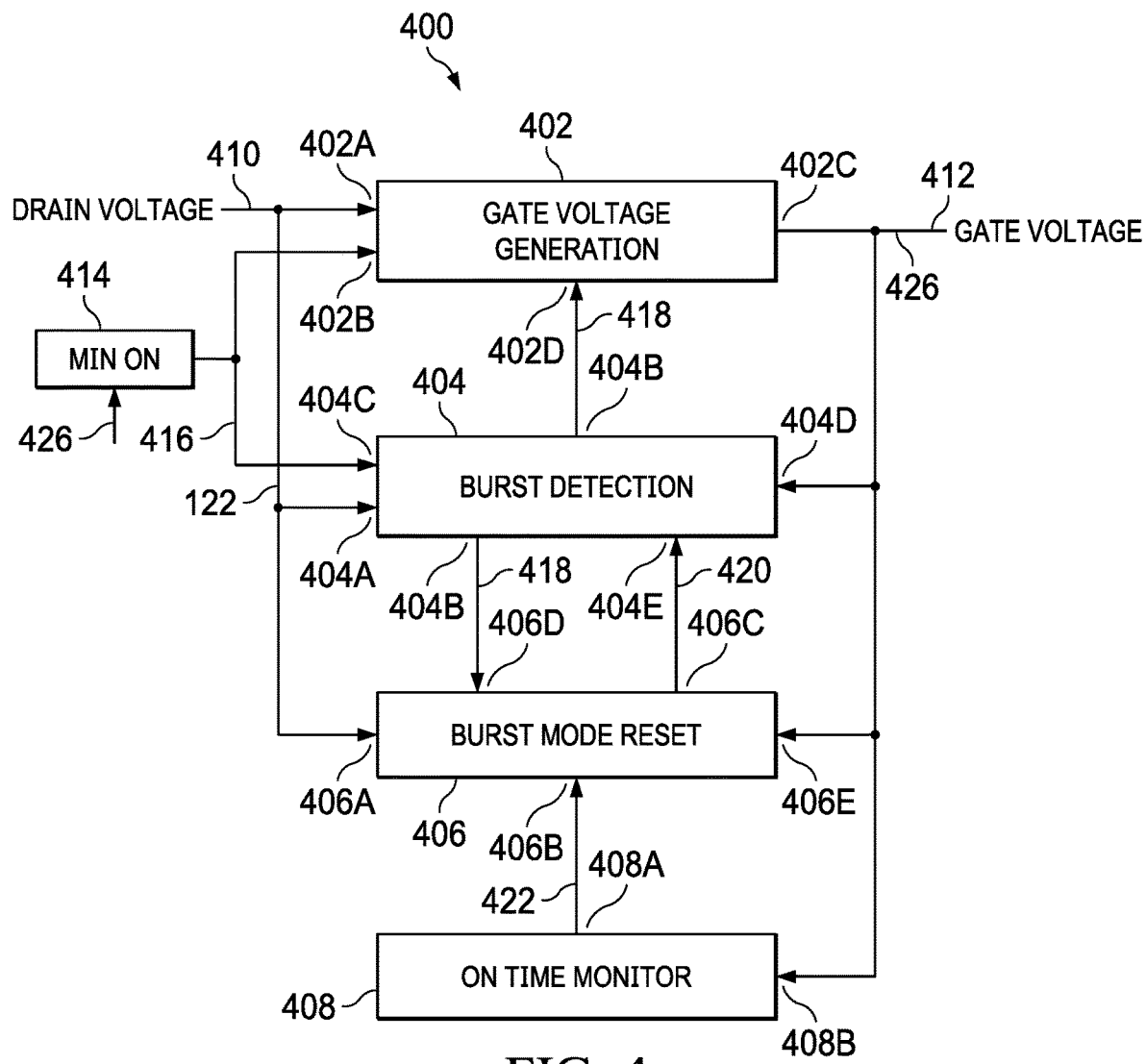
FIG. 4 shows a block diagram for an example synchronous rectifier control circuit suitable for use in a resonant DC-DC converter.

FIG. 4 shows a block diagram for an example synchronous rectifier control circuit 400 suitable for use in the LLC resonant converter 100. An implementation of the synchronous rectifier control circuit 102 may include two instances of the synchronous rectifier control circuit 400 to control the synchronous rectifier 118 and the synchronous rectifier 120. The synchronous rectifier control circuit 400 reduces incidence of the voltage transient 210 during burst mode operation without reducing the efficiency of the LLC resonant converter 100. The synchronous rectifier control circuit 400 includes a gate voltage generation circuit 402, a burst detection circuit 404, a burst mode reset circuit 406, an on-time monitor circuit 408, a drain voltage input terminal 410, a gate voltage output terminal 412, and a minimum on-time circuit 414.

The gate voltage generation circuit 402 includes an input 402A coupled to the drain voltage input terminal 410, an input 402B coupled to the minimum on-time circuit 414, an input 404D coupled to an output 404B of the burst detection circuit 404, and an output 402C coupled to the gate voltage output terminal 412. The gate voltage generation circuit 402 generates a control signal 426 (i.e., the gate voltage 124) for a synchronous rectifier (e.g., the synchronous rectifier 118) based on the drain voltage 122 of the synchronous rectifier 118, and a burst mode flag 418 indicating whether the LLC resonant converter 100 is operating in burst mode set by the burst detection circuit 404. A turn-on delay value generated by the gate voltage generation circuit 402 varies based on whether the burst mode flag 418 is set. If the burst mode flag 418 is set, indicating that the LLC resonant converter 100 is operating in burst mode, then a relatively long turn-on delay value is applied to prevent turn on of the synchronous rectifier 118 responsive to the capacitive current spike 206. If the burst mode flag 418 is reset, indicating that the LLC resonant converter 100 is not operating in burst mode, then a relatively short turn-on delay value is applied to turn on the synchronous rectifier 118 sooner and improve the efficiency of the LLC resonant converter 100.

The burst detection circuit 404 includes an input 404A coupled to the drain voltage input terminal 410, an output 404B coupled to the input 402D of the gate voltage generation circuit 402, an input 404C coupled to the minimum on-time circuit 414, an input 404D coupled to the output 402C of the gate voltage generation circuit 402 and the gate voltage output terminal 412, and an input 404E coupled to an output 406C of the burst mode reset circuit 406. The burst detection circuit 404 sets the burst mode flag 418 indicating that the LLC resonant converter 100 is operating in burst mode based on a drain voltage of the synchronous rectifier 118.

The burst mode reset circuit 406 includes an input 406A coupled to the drain voltage input terminal 410, an input 406B coupled to an output 408A of the on-time monitor circuit 408, an output 406C coupled to the input 404E of the burst detection circuit 404, an input 406D coupled to the output 404B of the burst detection circuit 404, and an input 406E coupled to the output 402C of the gate voltage generation circuit 402 and the gate voltage output terminal 412. If the burst detection circuit 404 has determined that the LLC resonant converter 100 is operating in burst mode, the burst mode reset circuit 406 determines whether the LLC resonant converter 100 has exited burst mode based on the drain voltage 122, and generates a burst reset signal 420 that resets the burst detection circuit 404 and the burst mode flag 418 if the LLC resonant converter 100 is no longer operating in burst mode.

The on-time monitor circuit 408 includes an output 408A coupled to the output 406B of the burst mode reset circuit 406, and an input 408B coupled to the output 402C of the gate voltage generation circuit 402 and the gate voltage output terminal 412. The on-time monitor circuit 408 measures one-half the duration of the gate control pulses (activations of the gate voltage 124) generated by the gate voltage generation circuit 402 in a previous cycle to generate a sample clock 422 for a current cycle, where the sample clock 422 has an edge corresponding in time to the middle of the gate control pulse. Because the gate control pulses in two consecutive cycles are of similar duration the measurement performed in one cycle is applicable to the next cycle. The on-time monitor circuit 408 may include an analog or digital timer circuit to measure the time that the gate voltage 124 is active, and an analog or digital timer circuit to generate an edge of the sample clock 422 at a time corresponding to one-half the time that the gate voltage 124 is active.

The minimum on-time circuit 414 generates a minimum on-time pulse 416 for each activation of the control signal 426. The minimum on-time pulse 416 defines the minimum time that the control signal 426 remains active. For example, the 414 may be implemented as pulse generator that generates a pulse having minimum on-time duration at a leading edge of the control signal 426.

Figure 5:
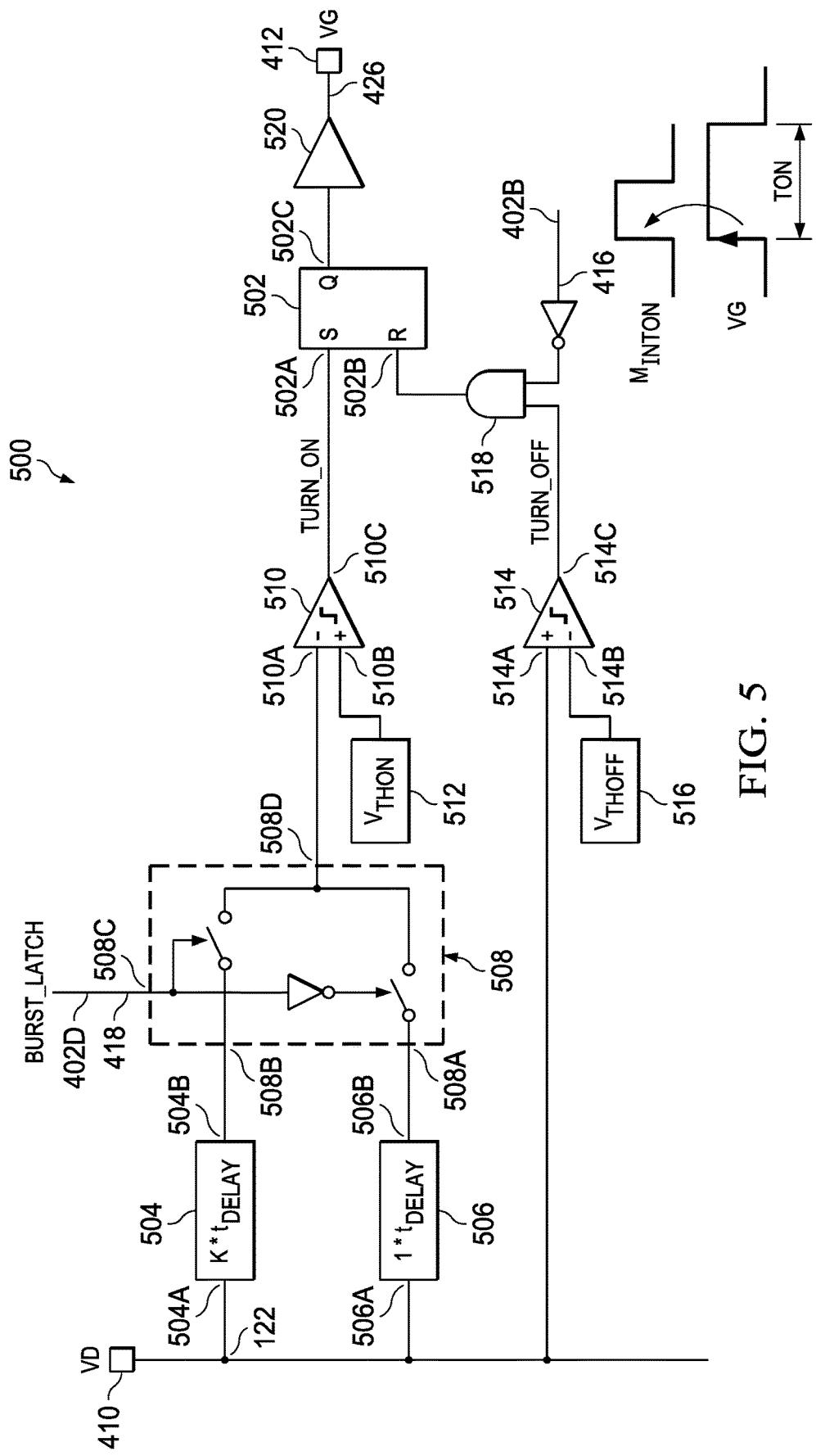
FIG. 5 shows a schematic diagram for an example gate voltage generation circuit suitable for use in the synchronous rectifier control circuit of FIG. 4.

FIG. 5 shows a schematic diagram for an example gate voltage generation circuit 500 suitable for use in the synchronous rectifier control circuit 400. The gate voltage generation circuit 500 is an implementation of the gate voltage generation circuit 402. The gate voltage generation circuit 500 includes a set-reset (SR) latch 502, a delay circuit 504, a delay circuit 506, a selector circuit 508, a comparator 510, an on-voltage threshold circuit 512, a comparator 514, an off-voltage threshold circuit 516, an AND gate 518, and a transistor driver circuit 520. The comparator 510 compares on the two delayed versions of the drain voltage 122 to an on-threshold voltage to set the SR latch 502 and activate the control signal 426. The comparator 514 compares the drain voltage 122 to an off-threshold voltage to reset the SR latch 502 and deactivate the control signal 426.

The delay circuit 506 includes an input 506A coupled to the drain voltage input terminal 410, and an output 506B coupled to an input 508A of the selector circuit 508. The delay circuit 506 may be implemented as a number of serially connected buffers selected to provide a given time delay.

The delay circuit 504 includes an input 504A coupled to the drain voltage input terminal 410, and an output 504B coupled to an input 508B of the selector circuit 508. The delay circuit 504 may be implemented as a number of serially connected buffers selected to provide a given time delay. The time delay provided by the delay circuit 504 is relatively long with respect to the time delay provided by the delay circuit 506. For example, the delay circuit 504 may provide a time delay that is 2×, 3×, 4×, etc. that provided by the delay circuit 506. Generally, the time delay provided by the delay circuit 504 is sufficient to ensure that activation and subsequent deactivation of the control signal 426 will not produce the voltage transient 210.

The selector circuit 508 includes an input 508A coupled to the output 506B of the delay circuit 506, an input 508B coupled to the output 504B of the delay circuit 504, an input 508C coupled to the output 404B of the burst detection circuit 404, and an output 508D coupled to an input 510A of the comparator 510. The selector circuit 508 routes the delayed drain voltage 122 received from the delay circuit 504 or the delayed drain voltage 122 received from the delay circuit 506 to the comparator 510. If the burst mode flag 418 is set, then the selector circuit 508 routes the delayed drain voltage 122 received from the delay circuit 504 to the comparator 510, and if the burst mode flag 418 is reset, then the selector circuit 508 routes the delayed drain voltage 122 received from the delay circuit 506 to the comparator 510. By selecting the delay applied to set the SR latch 502 based on the burst mode flag 418, the gate voltage generation circuit 500 reduces the incidence of the voltage transient 210 without reducing the efficiency of the LLC resonant converter 100.

The comparator 510 includes an input 510A coupled to the output 508D of the selector circuit 508, an input 510B coupled to the on-voltage threshold circuit 512, and an output 510C coupled to an input 502A of the SR latch 502. The comparator 510 compares the delayed drain voltage 122 received from the selector circuit 508 to the on-threshold voltage received from the on-voltage threshold circuit 512. If the on-threshold voltage is greater than the delayed drain voltage 122, the output signal of the comparator 510 is activated to set the SR latch 502.

The SR latch 502 includes an input 502A coupled to the output 510C of the comparator 510, an input 502B coupled to the AND gate 518, and an output 502C coupled to the transistor driver circuit 520. The SR latch 502 is set, to activate the control signal 426 if the output signal of the comparator 510 is active, and is reset, to deactivate the control signal 426 if the output signal of the AND gate 518 is active.

The transistor driver circuit 520 is coupled to the SR latch 502 and the gate voltage output terminal 412. The transistor driver circuit 520 level shifts the output signal received from the SR latch 502 to meet the threshold voltage requirements of the synchronous rectifier 118.

The comparator 514 includes an input 514A coupled to the drain voltage input terminal 410, an input 514B coupled to the off-voltage threshold circuit 516, and an output 514C coupled to the AND gate 518. The comparator 514 compares the drain voltage 122 to the off-threshold voltage received from the off-voltage threshold circuit 516. If the drain voltage 122 is greater than the off-threshold voltage, the output signal of the comparator 514 is activated to reset the SR latch 502.

The AND gate 518 is coupled to the comparator 514 and minimum on-time circuit 414. The AND gate 518 ensures that the SR latch 502 is not reset while the minimum on-time pulse 416 received from the minimum on-time circuit 414 is active. That is, the AND gate 518 ensures that the control signal 426 is active for at least the duration of the minimum on-time pulse 416.

In some implementations of the gate voltage generation circuit 500, the delay circuit 504, the delay circuit 506, and the selector circuit 508 are disposed between the output 510C of the comparator 510 and the input 502A of the SR latch 502, and the input 510A of the comparator 510 is coupled to the drain voltage input terminal 410. In such implementations, the comparator 510 receives the undelayed drain voltage 122, and the output signal of the comparator 510 is delayed by the delay circuit 504 and the delay circuit 506. The selector circuit 508 selects one of the delay circuit 504 or the delay circuit 506 based on the burst mode 418. An AND gate is disposed between the selector circuit 508 and the SR latch 502, and combines the delayed comparator output signal provided by the selector circuit 508 and the undelayed output signal of the comparator 510 to generate a signal for setting the SR latch 502 at the input 502A of the SR latch 502.

Figure 6:
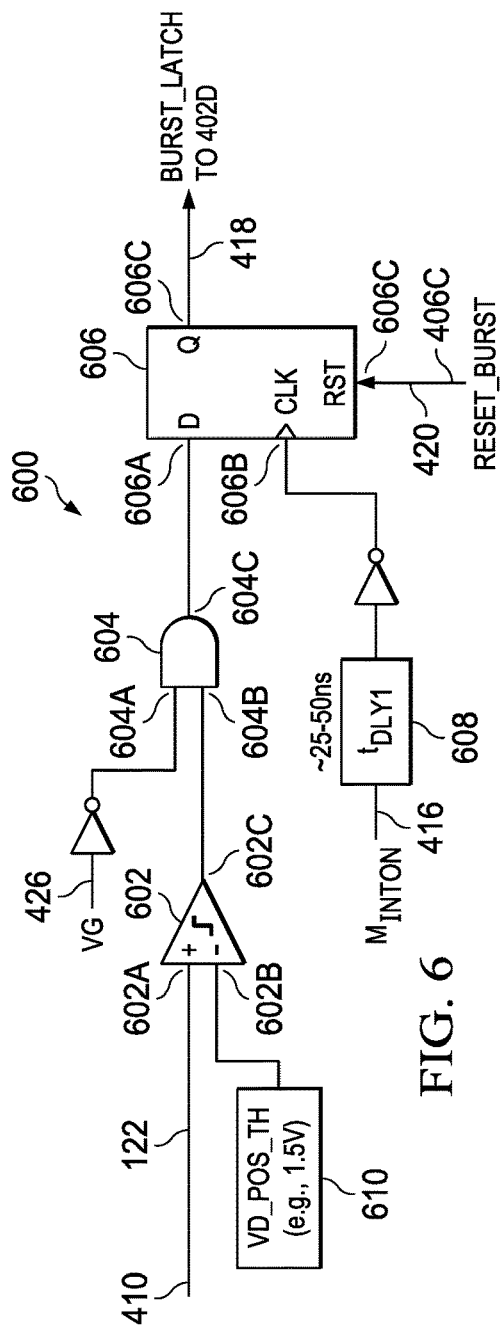
FIG. 6 shows a schematic diagram for an example burst detection circuit suitable for use in the synchronous rectifier control circuit of FIG. 4.

FIG. 6 shows a schematic diagram for an example burst detection circuit 600 suitable for use in the synchronous rectifier control circuit 400. The burst detection circuit 600 is an implementation of the burst detection circuit 404. The burst detection circuit 600 includes a comparator 602, an AND gate 604, a flip-flop 606, delay circuit 608, and threshold voltage circuit 610. The burst detection circuit 600 compares the drain voltage 122 to a threshold voltage generated by the threshold voltage circuit 610 to determine whether the LLC resonant converter 100 is operating in burst mode. If the drain voltage 122 exceeds the threshold voltage, and the control signal 426 is inactive at the end of the minimum on-time pulse 416, then the LLC resonant converter 100 is operating in burst mode, and the burst detection circuit 600 sets the burst mode flag 418.

The comparator 602 includes an input 602A coupled to the drain voltage input terminal 410, an input 602B coupled to the threshold voltage circuit 610, and an output 602C coupled to the input 604B of the AND gate 604. The comparator 602 compares the drain voltage 122 to the threshold voltage generated by the threshold voltage circuit 610.

The AND gate 604 includes an input 604A coupled to the gate voltage output terminal 412, an input 604B coupled to the 602C of the comparator 602, and an output 604C coupled to the input 606A of the flip-flop 606. The AND gate 604 passes the output signal generated by the comparator 602 only when the control signal 426 is inactive.

The flip-flop 606 includes an input 606A coupled to the output 604C of the AND gate 604, an input 606B coupled to the delay circuit 608, an input 606C coupled to the output 406C of the burst mode reset circuit 406, and an output 606D coupled to the input 402D of the gate voltage generation circuit 402. The flip-flop 606 is clocked by the delayed trailing edge of the minimum on-time pulse 416. If the output signal of the AND gate 604 is active when the minimum on-time pulse 416 ends, then the flip-flop 606 is set (and the burst mode flag 418 is set) to indicate that the LLC resonant converter 100 is operating in burst mode. When the burst reset signal 420 is activated, the flip-flop 606 is reset (and the burst mode flag 418 is reset) to indicate that the LLC resonant converter 100 is not operating in burst mode.

The delay circuit 608 delays the minimum on-time pulse 416 by a predetermined time. The delay circuit 608 may be implemented as a number of serially connected buffers selected to provide the predetermined time delay.

Figure 7:
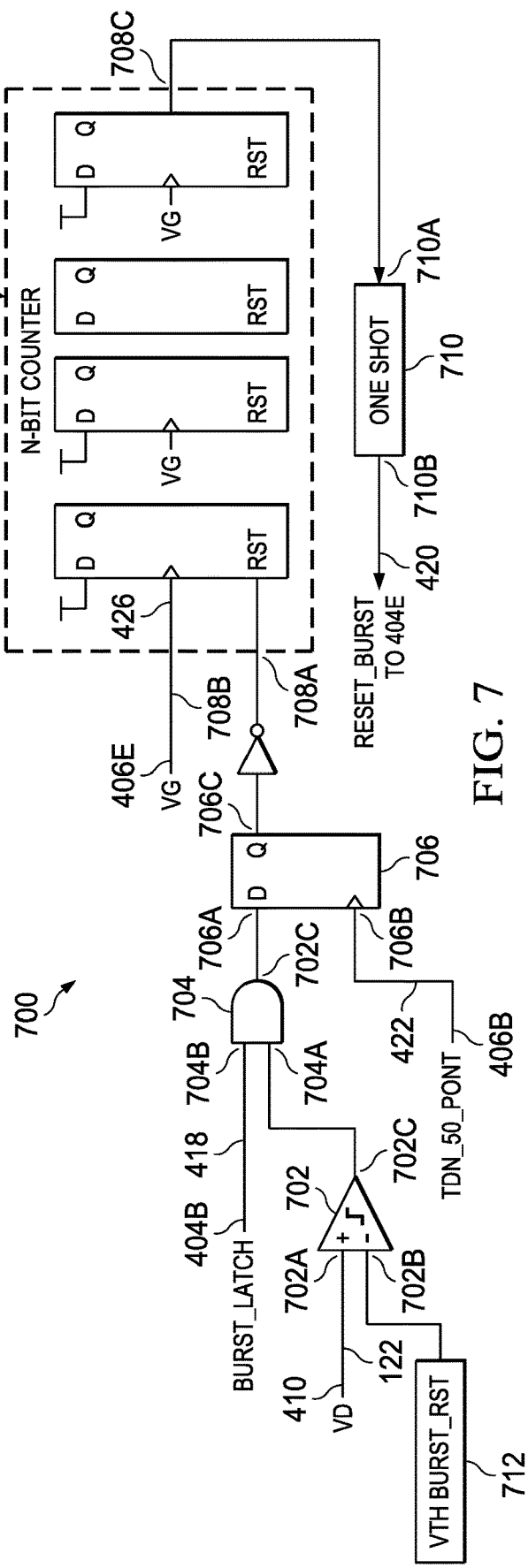
FIG. 7 shows a schematic diagram for an example burst mode reset circuit suitable for use in the synchronous rectifier control circuit of FIG. 4.

FIG. 7 shows a schematic diagram for an example burst mode reset circuit 700 suitable for use in the synchronous rectifier control circuit 400. The burst mode reset circuit 700 is an implementation of the burst mode reset circuit 406. The burst mode reset circuit 700 includes a comparator 702, an AND gate 704, a flip-flop 706, a counter 708, and a pulse generation circuit 710. The burst mode reset circuit 700 compares the drain voltage 122 to a threshold voltage that indicates whether the current in the synchronous rectifier 118 is above a threshold current, and if the drain voltage 122 exceeds the threshold in a predetermined number of successive activations of the synchronous rectifier 118, then the LLC resonant converter 100 is deemed to be not in burst mode, and the burst mode reset circuit 700 generates a burst reset signal 420 to reset the burst detection circuit 404.

The comparator 702 includes an input 702A coupled to the drain voltage input terminal 410, an input 702B coupled to the threshold voltage circuit 712, and an output 702C coupled to the input 704A of the comparator 702. The comparator 702 compares the drain voltage 122 to the threshold voltage generated by the threshold voltage circuit 712.

The AND gate 704 includes an input 704A coupled to the output 702C of the comparator 702, an input 704B coupled to the output 404B of the burst detection circuit 404, and an output 704C coupled to an input 706A of the flip-flop 706. The AND gate 704 passes the output signal generated by the comparator 702 if the burst mode flag 418 is active (i.e., if the LLC resonant converter 100 is deemed to be operating in burst mode).

The flip-flop 706 includes an input 706A coupled to the output 704C of the AND gate 704, an input 706B coupled to the output 406B of the burst mode reset circuit 406, and an output 706C coupled to the input 708A of the counter 708. The flip-flop 706 samples the output of the comparator 702 on an edge of the sample clock 422 representing a mid-point time of the control signal 426. When inactive, the output signal generated by the flip-flop 706 resets the counter 708. That is, when the signal sampled by the flip-flop 706 indicates that the drain voltage 122 exceeds the threshold voltage, then counter 708 is enabled to increment, otherwise the counter 708 is reset.

The counter 708 includes an input 708A coupled to the output 706C of the flip-flop 706, and input 708B coupled to the output 402C of the gate voltage generation circuit 402, and an output 708C coupled to the input 710A of the pulse generation circuit 710. The counter 708 includes a plurality of flip-flops that may be arranged as a binary counter, a shifter, or other circuit that is incremented at an edge of the control signal 426 and reset by output signal of the flip-flop 706. When the counter 708 increments to a predetermined value, the counter 708 activates a signal at the output 708C. For example, if the counter 708 increments to a value of 8, indicating that in 8 successive activations of the control signal 426 the drain voltage 122 has exceeded the threshold voltage, then the counter 708 activates a signal at the output 708C.

The pulse generation circuit 710 includes an input 710A coupled to the output 708C of the counter 708, and an output 710B coupled to the input 404E of the burst detection circuit 404. The pulse generation circuit 710 generates a pulse at the leading edge of the signal output by the counter 708. The pulse forms the burst reset signal 420 provided to the burst detection circuit 404 to reset the burst mode flag 418.

Figure 8:
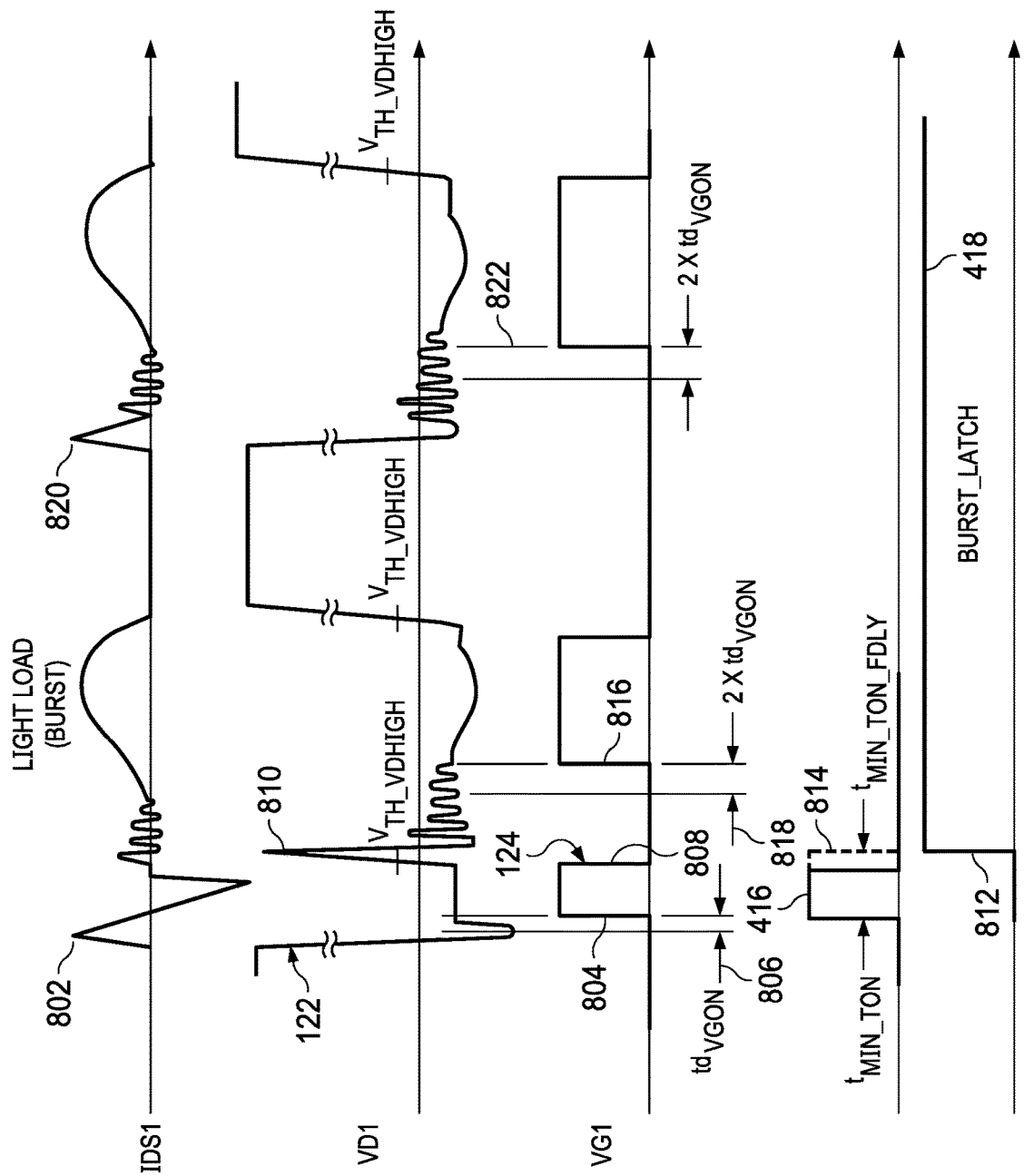
FIG. 8 shows signals generated by operation of the LLC resonant converter of FIG. 1 using the synchronous rectifier control circuit of FIG. 4.

FIG. 8 shows signals generated by operation of an implementation of the LLC resonant converter 100 that includes the synchronous rectifier control circuit 400. The LLC resonant converter 100 is operating in burst mode. The capacitive current spike 802 pulls the drain voltage 122 down, and after expiration of the short turn on delay 806 the synchronous rectifier control circuit 400 activates the gate voltage 124 at time 804 to turn on the synchronous rectifier 118. The gate voltage 124 remains active for at least the duration of the minimum on-time pulse 416. At time 808, the synchronous rectifier control circuit 400 deactivates the gate voltage 124 creating the transient voltage 810. At time 814, after expiration of the delay generated by the delay circuit 608, the synchronous rectifier control circuit 400 compares the drain voltage 122 to a threshold voltage to detect the transient. Detection of the transient indicates that the LLC resonant converter 100 is operating in burst mode. At time 812, the synchronous rectifier control circuit 400 sets the burst mode flag 418. At time 816 current is flowing in the synchronous rectifier 118, and the synchronous rectifier control circuit 400 activates the gate voltage 124 after expiration of the long delay 818.

While the burst mode flag 418 is set, the synchronous rectifier control circuit 400 applies a long delay to activation of the gate voltage 124. Consequently, when the capacitive current spike 820 occurs in the next cycle of the burst, the synchronous rectifier control circuit 400 delays activation of the gate voltage 124 until time 822 when current is flowing in the synchronous rectifier 118. Thus, the synchronous rectifier control circuit 400 avoids the build-up of negative current and the potentially damaging voltage transient that results from the negative current.

Figure 9:
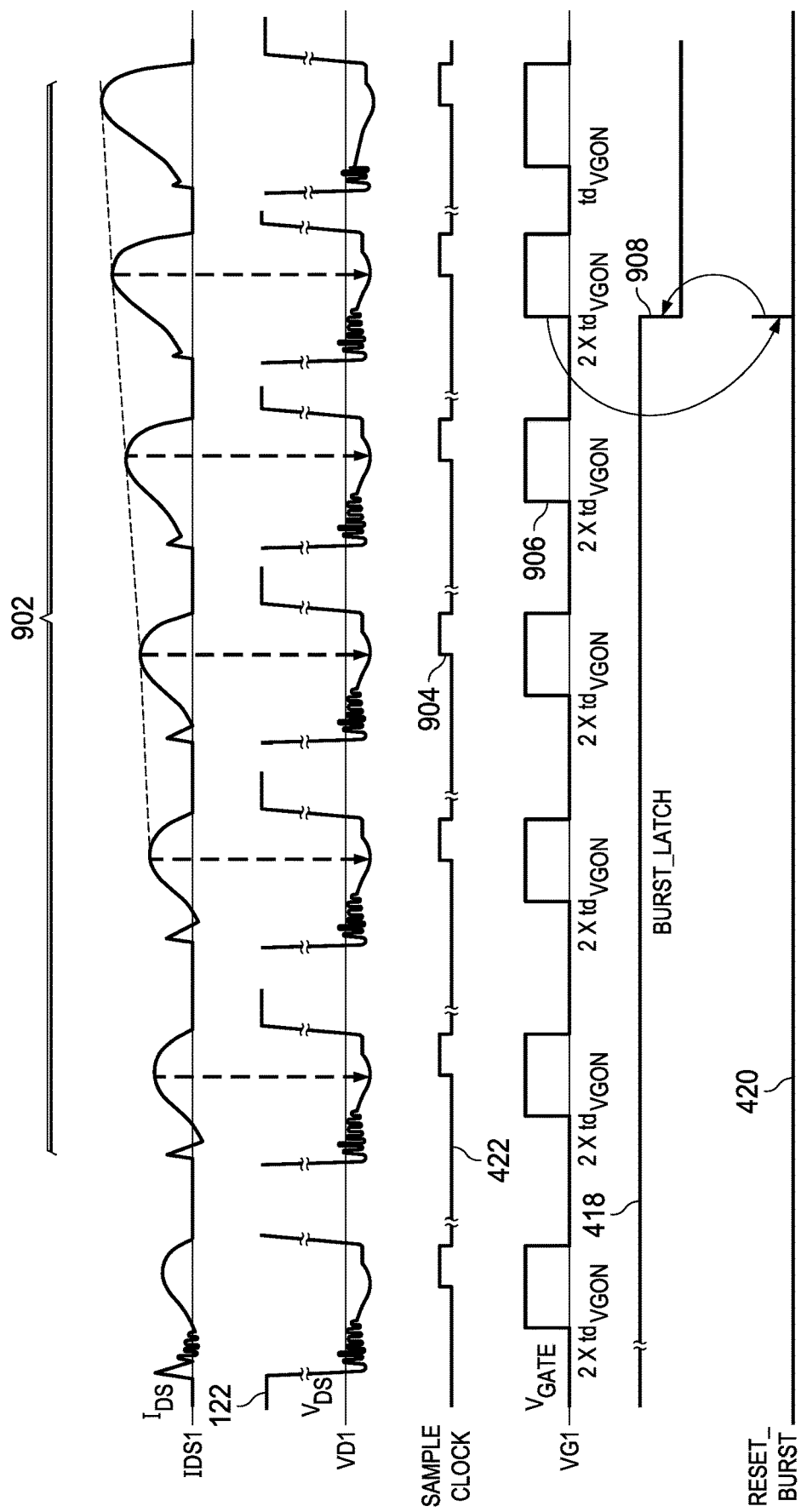
FIG. 9 shows reset of a burst mode flag by operation of the burst mode reset circuit of FIG. 7.

FIG. 9 shows reset of the burst mode flag 418 by operation of the burst mode reset circuit 700. The LLC resonant converter 100 is operating in burst mode, and the burst mode reset circuit 700 samples the comparison of the drain voltage 122 to the threshold voltage generated by the threshold voltage circuit 712 at each rising edge of the sample clock 422. In the series of pulses 902, the drain voltage 122 exceeds the threshold voltage generated by the threshold voltage circuit 712, and the counter 708 is incremented on each edge of the control signal 426. When the counter 708 increments to a predetermined value (e.g., 7, 8, or other predetermined value), indicating that the LLC resonant converter 100 is no longer operating in burst mode, the pulse generation circuit 710 generates the burst reset signal 420 and the burst mode flag 418 is reset. In turn, the selector circuit 508 selects the output of the delay circuit 506 to improve the efficiency of the synchronous rectifier control circuit 400.

Figure 10:
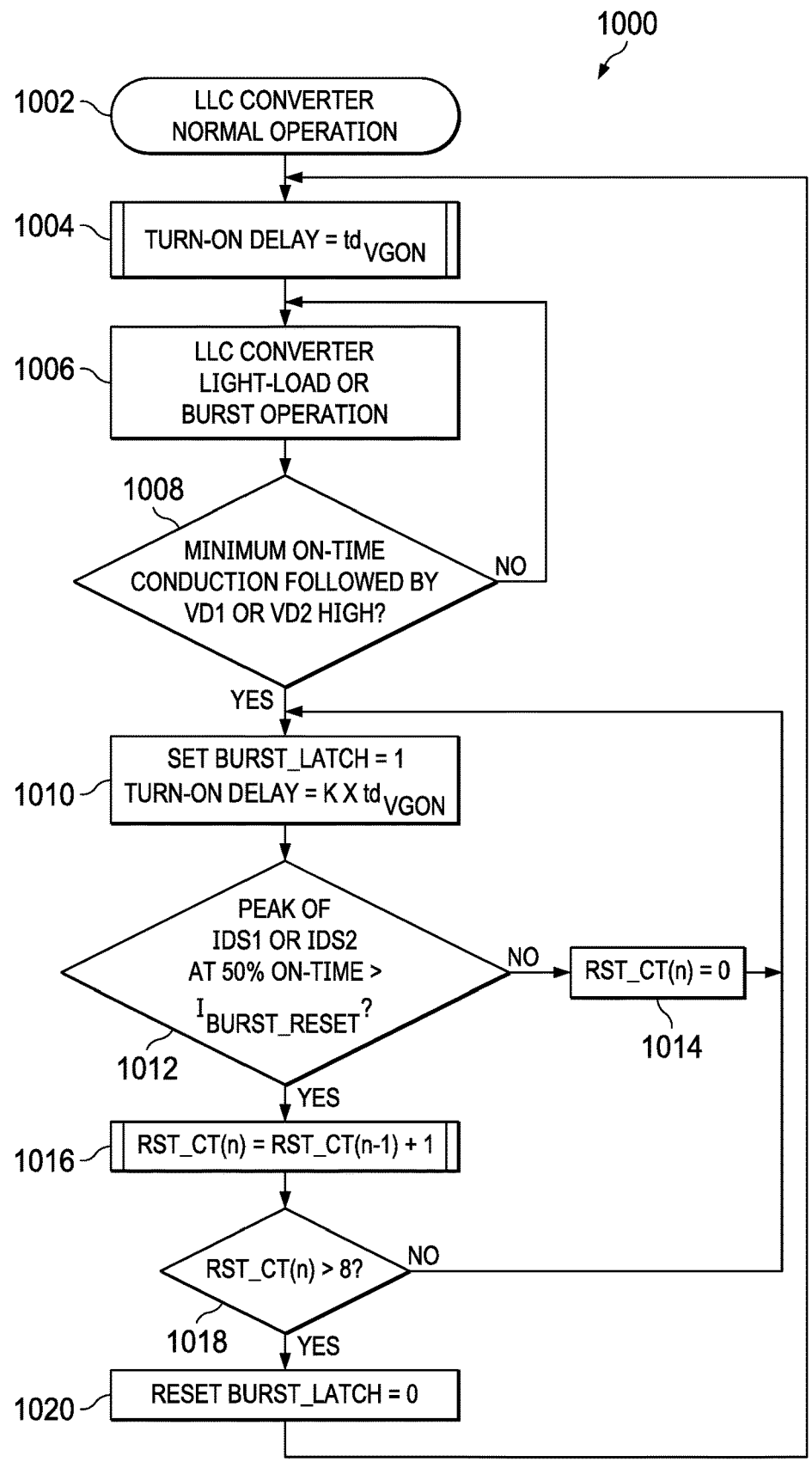
FIG. 10 shows a flow diagram for an example method for controlling a synchronous rectifier in a resonant converter.

FIG. 10 shows a flow diagram for an example method 1000 for controlling a synchronous rectifier in a resonant converter. Though depicted sequentially as a matter of convenience, at least some of the actions shown can be performed in a different order and/or performed in parallel. Additionally, some implementations may perform only some of the actions shown. The operations of the method 1000 may be performed by an implementation of the LLC resonant converter 100 that includes the synchronous rectifier control circuit 400.

In block 1002, the LLC resonant converter 100 is operating in normal (non-burst) mode. Because the LLC resonant converter 100 is operating in non-burst mode, the delay circuit 506 is selected by the selector circuit 508 to provide input to the comparator 510 in block 1004.

In block 1006, the burst detection circuit 600 determines whether the LLC resonant converter 100 is operating in burst mode or non-burst mode. In block 1008, if the burst detection circuit 600 determines that the LLC resonant converter 100 is operating in burst mode, then in block 1010, the burst detection circuit 600 sets the burst mode flag 418 and the delay circuit 504 is selected by the selector circuit 508 to provide input to the comparator 510.

In block 1012, the burst mode reset circuit 700 compares the drain voltage 122 to the threshold voltage generated by the threshold voltage circuit 712 to determine whether the current in the synchronous rectifier 118 exceeds a burst threshold current. The burst mode reset circuit 700 samples the comparison at the rising edge of the sample clock 422 (the 50% on-time of the gate voltage 124). If the sampled comparison exceeds the threshold voltage, then the counter 708 is incremented on the rising edge of the gate voltage 124 in block 1016.

If, in block 1018, the value of the counter 708 exceeds a burst reset count value, then the burst mode flag 418 is reset in block 1020 and operation of the synchronous rectifier control circuit 400 continues in block 1004.

Modifications are possible in the described embodiments, and other embodiments are possible, within the scope of the claims.

What is claimed is:

1. A synchronous rectifier control circuit, comprising:
   a drain voltage input;
   a gate voltage output;
   a gate voltage generation circuit comprising:
      a first input coupled to the drain voltage input; and
      an output coupled to the gate voltage output;
   a burst detection circuit comprising:
      a first input coupled to the drain voltage input; and
      an output coupled to a second input of the gate voltage generation circuit;
   a minimum on-time circuit comprising:
      an input coupled to an output of the gate voltage generation circuit; and
      a single output coupled to an input of the gate voltage generation circuit and an input of the burst detection circuit;
   a burst mode reset circuit comprising:
      an input coupled to the drain voltage input; and
      an output coupled to a second input of the burst detection circuit.

2. The synchronous rectifier control circuit of claim 1, wherein the gate voltage generation circuit comprises:
   a set-reset (SR) latch comprising an output coupled to the gate voltage output;
   a first delay circuit comprising an input coupled to the drain voltage input; and
   a second delay circuit comprising an input coupled to the drain voltage input; and
   a selector circuit comprising:
      a first input coupled to an output of the first delay circuit;
      a second input coupled to an output of the second delay circuit;
      a third input coupled to the output of the burst detection circuit; and
      an output coupled to an input of the SR latch.

3. The synchronous rectifier control circuit of claim 1, wherein the burst detection circuit comprises:
a comparator comprising:
a first input coupled to the drain voltage input; and
a second input coupled to a threshold voltage circuit;
an AND gate comprising:
a first input coupled to an output of the comparator; and
a second input coupled to the output of the gate voltage generation circuit; and
a flip-flop comprising:
a first input coupled to an output of the AND gate;
a second input coupled to a minimum on-time circuit; and
an output coupled to the gate voltage generation circuit.

4. The synchronous rectifier control circuit of claim 1, wherein:
the input of the burst mode reset circuit is a first input; and
the synchronous rectifier control circuit further comprises an on-time monitor circuit comprising:
an input coupled to the output of the gate voltage generation circuit; and
an output coupled to a second input of the burst mode reset circuit.

5. The synchronous rectifier control circuit of claim 4, wherein the on-time monitor circuit comprises a timer circuit configured to measure one-half of a duration of a gate control pulse generated by the gate voltage generation circuit.

6. The synchronous rectifier control circuit of claim 4, wherein the burst mode reset circuit comprises:
a comparator comprising:
a first input coupled to the drain voltage input; and
a second input coupled to a threshold voltage circuit;
an AND gate comprising:
a first input coupled to an output of the comparator; and
a second input coupled to the output of the burst detection circuit;
a flip-flop comprising:
a first input coupled to an output of the AND gate; and
a second input coupled the output of the on-time monitor circuit;
a counter comprising:
a first input coupled to an output of the flip-flop; and
a second input coupled to the output of the gate voltage generation circuit; and
a pulse generation circuit comprising:
an input coupled to an output of the counter; and
an output coupled to the second input of the burst detection circuit.

7. The synchronous rectifier control circuit of claim 1, wherein the burst detection circuit is configured to identify burst mode operation based on voltage at the drain voltage input exceeding a threshold voltage at a minimum on-time, and a gate control voltage at the output of the gate voltage generation circuit being set to deactivate a synchronous rectifier.

8. A synchronous rectifier control circuit, comprising:
a burst detection circuit configured to set a flag indicating that a switch-mode power supply circuit coupled to a synchronous rectifier is operating in burst mode based on a drain voltage of the synchronous rectifier;
a gate voltage generation circuit configured to generate a control signal for the synchronous rectifier based on the drain voltage of the synchronous rectifier, and the flag set by the burst detection circuit; and
an on-time monitor circuit configured to measure one-half of a duration of the control signal.

9. The synchronous rectifier control circuit of claim 8, wherein the gate voltage generation circuit is configured to:
apply a first delay to activation of the control signal based on the flag being reset; and
apply a second delay to the activation of the control signal based on the flag being set;
wherein the second delay is longer than the first delay.

10. The synchronous rectifier control circuit of claim 8, wherein the burst detection circuit is configured to set the flag based on the drain voltage exceeding a predetermined threshold and the control signal being inactive at an end of a minimum synchronous rectifier on-time.

11. The synchronous rectifier control circuit of claim 8, further comprising a burst mode reset circuit configured to reset the burst detection circuit based on the drain voltage of the synchronous rectifier.

12. The synchronous rectifier control circuit of claim 11, wherein the burst mode reset circuit is configured to sample the drain voltage of the synchronous rectifier at a time corresponding to one-half of a duration of the control signal.

13. The synchronous rectifier control circuit of claim 12, wherein the burst mode reset circuit is configured to generate a reset signal to reset the burst detection circuit based on a predetermined number of consecutive samples of the drain voltage of the synchronous rectifier exceeding a predetermined threshold.

14. A switch-mode power supply, comprising:
a transformer;
a synchronous rectifier coupled to a secondary winding of the transformer;
a synchronous rectifier control circuit coupled to the synchronous rectifier, and comprising:
an input coupled to a drain terminal of the synchronous rectifier;
an output coupled to a gate terminal of the synchronous rectifier;
a gate voltage generation circuit comprising:
a first input coupled to the input of the synchronous rectifier control circuit; and
an output coupled to the output of the synchronous rectifier control circuit;
a burst detection circuit comprising:
a first input coupled to the input of the synchronous rectifier control circuit; and
an output coupled to a second input of the gate voltage generation circuit;
a minimum on-time circuit comprising:
an input coupled to an output of the gate voltage generation circuit; and
a single output coupled to an input of the gate voltage generation circuit and an input of the burst detection circuit; and
a burst mode reset circuit comprising:
an input coupled to the input of the synchronous rectifier control circuit; and
an output coupled to a second input of the burst detection circuit.

15. The switch-mode power supply of claim 14, wherein the gate voltage generation circuit comprises:
a set-reset (SR) latch comprising an output coupled to the output of the synchronous rectifier control circuit;
a first delay circuit comprising an input coupled to the input of the synchronous rectifier control circuit;
a second delay circuit comprising an input coupled to the input of the synchronous rectifier control circuit; and
a selector circuit comprising:

a first input coupled to an output of the first delay circuit;

a second input coupled to an output of the second delay circuit;

a third input coupled to the output of the burst detection circuit; and an output coupled to an input of the SR latch.

16. The switch-mode power supply of claim 15, wherein the gate voltage generation circuit comprises a comparator comprising:

a first input coupled to the input of the synchronous rectifier control circuit;

a second input coupled to a threshold voltage circuit; and an output coupled to the input of the SR latch.

17. The switch-mode power supply of claim 16, wherein:

the comparator is a first comparator;

the threshold voltage circuit is a first threshold voltage circuit;

the input of the SR latch is a first input; and the gate voltage generation circuit comprises a second comparator, comprising:

a first input coupled to the input of the synchronous rectifier control circuit;

a second input coupled to a second threshold voltage circuit; and an output coupled to a second input of the SR latch.

18. The switch-mode power supply of claim 14, wherein the burst detection circuit comprises:

a comparator comprising:

a first input coupled to the input of the synchronous rectifier control circuit; and a second input coupled to a threshold voltage circuit;

an AND gate comprising:

a first input coupled to an output of the comparator; and a second input coupled to the output of the synchronous rectifier control circuit; and a flip-flop comprising:

a first input coupled to an output of the AND gate;

a second input coupled to a minimum on-time circuit; and an output coupled to the gate voltage generation circuit.

19. The switch-mode power supply of claim 14, wherein:

the input of the burst mode reset circuit is a first input; and the synchronous rectifier control circuit further comprises an on-time monitor circuit comprising:

an input coupled to the output of the gate voltage generation circuit; and an output coupled to a second input of the burst mode reset circuit; and the burst mode reset circuit comprises:

a comparator comprising:

a first input coupled to the input of the synchronous rectifier control circuit; and a second input coupled to a threshold voltage circuit;

an AND gate comprising:

a first input coupled to an output of the comparator; and a second input coupled to the output of the burst detection circuit;

a flip-flop comprising:

a first input coupled to an output of the AND gate; and a second input coupled the output of the on-time monitor circuit;

a counter comprising:

a first input coupled to an output of the flip-flop; and a second input coupled to the output of the gate voltage generation circuit; and a pulse generation circuit comprising:

an input coupled to an output of the counter; and an output coupled to the second input of the burst detection circuit.

* * * * *